United States Patent
Guo et al.

(10) Patent No.: US 8,715,776 B2
(45) Date of Patent: May 6, 2014

(54) METHOD FOR PROVIDING AFM EXCHANGE PINNING FIELDS IN MULTIPLE DIRECTIONS ON SAME SUBSTRATE

(75) Inventors: Yimin Guo, San Jose, CA (US); Grace Gorman, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 1217 days.

(21) Appl. No.: 11/904,668

(22) Filed: Sep. 28, 2007

(65) Prior Publication Data

US 2009/0087589 A1    Apr. 2, 2009

(51) Int. Cl.
  *B05D 5/12* (2006.01)
(52) U.S. Cl.
  USPC .......................................................... 427/128
(58) Field of Classification Search
  USPC .......................................................... 427/128
  See application file for complete search history.

(56) References Cited

U.S. PATENT DOCUMENTS

| | | | | |
|---|---|---|---|---|
| 5,898,547 A * | 4/1999 | Fontana et al. | ............ | 360/324.2 |
| 7,054,114 B2 | 5/2006 | Jander et al. | | |
| 7,060,509 B2 | 6/2006 | De Haas et al. | | |
| 7,152,304 B2 * | 12/2006 | Horng et al. | ............ | 29/603.08 |
| 2002/0180433 A1 * | 12/2002 | Van Zon et al. | ............ | 324/252 |
| 2004/0212360 A1 * | 10/2004 | Sato et al. | ............ | 324/200 |
| 2005/0174701 A1 * | 8/2005 | Kasiraj et al. | ............ | 360/324.2 |
| 2006/0171081 A1 * | 8/2006 | Breuer et al. | ............ | 360/313 |

FOREIGN PATENT DOCUMENTS

| | | |
|---|---|---|
| JP | 2001-028110 | 1/2001 |
| JP | 2002-299728 | 10/2002 |
| JP | 2004-533120 | 10/2004 |

OTHER PUBLICATIONS

TalkTalk website, magnetic material, Accessed: Jun. 9, 2010.*
Tiusan et al., Magnetic-roughness-induced magnetostatic interactions in magnetic tunnel junctions, The European Physical Journal B, p. 431 last para.*
Japanese Office Action, 2008-250981, Mailed—Apr. 3, 2013.
Co-pending U.S. Appl. No. 11/881,349, filed Jul. 26, 2007, "Magnetic Field Angle Sensor With GMR or MTJ Elements", assigned to the same assignees as the present invention.
"Applications of Magnetic Position Sensors", Honey well, Sensor Products, AN211, Solid State Elec. Center, pp. 1-8.
"Exchange Anisotrophy and Micromagnetic Properties of PtMn/NiFe Bilayers", by Taras Pokhil et al., Journal of Applied Physics, vol. 89, No. 11, Jun. 1, 2001, pp. 6588-6590.
"Angular Sensor Using Tunneling Magnetoresistive Junctions With an Artificial Antiferromagnet Reference Electrode and Improved Thermal Stability", IEEE Trans. on Magnetics, vol. 40, No. 1, Jan. 2004, by Manfred Ruhrig et al., pp. 101-104.

* cited by examiner

*Primary Examiner* — Michael Cleveland
*Assistant Examiner* — Tabatha Penny
(74) *Attorney, Agent, or Firm* — Saile Ackerman LLC; Stephen B. Ackerman (57) ABSTRACT

Simultaneous setting of exchange pinning field magnetization in more than one direction for several thin film structures on a single substrate has been achieved by first orienting the structures as needed. A layer of hard magnetic material is then deposited, suitably patterned to control the direction of its flux, and then magnetized through a single exposure to a strong magnetic field. The assemblage is then thermally annealed (in the absence of any applied field) at a temperature higher than the AFM material blocking temperature, following which the thin film structures are magnetically pinned in the intended directions.

26 Claims, 5 Drawing Sheets

METHOD FOR PROVIDING AFM EXCHANGE PINNING FIELDS IN MULTIPLE DIRECTIONS ON SAME SUBSTRATE

This application is related to HMG07-007, filed on Jul. 26, 2007 as application Ser. No. 11/881,349, now U.S. Pat. No. 7,394,247, and herein incorporated, by reference, in its entirety.

FIELD OF THE INVENTION

The invention relates to the general field of magnetized thin films with particular reference to achieving more than one direction of exchange pinned magnetization on a given substrate simultaneously. An important application of the invention is to a magnetic field angle sensor using highly sensitive MTJ or GMR islands.

BACKGROUND OF THE INVENTION

Figure 1:
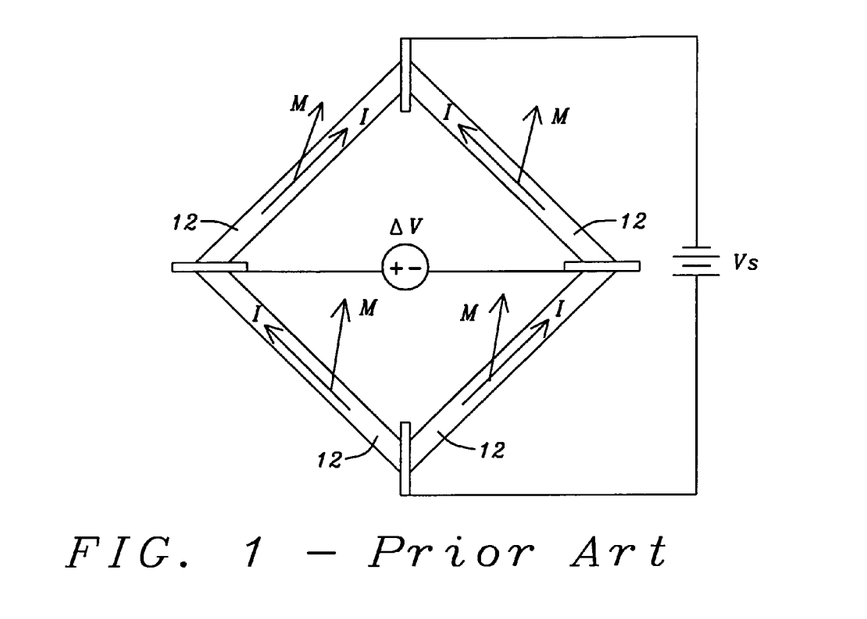
FIG. 1. is a schematic view of an angle sensor of the prior art. An electric current flows across a single Wheatstone bridge made up of four identical AMR stripes.

An example of a prior art structure is a conventional angle sensor in which the sensing islands are four long anisotropic magneto-resistance (AMR) stripes 12 oriented in a diamond shape with the ends connected together by metallization to form a Wheatstone bridge, as shown in FIG. 1. Typically, these anisotropic magneto-resistance (AMR) stripes are made of Permalloy material. The top and bottom connections of the four identical islands are given a direct current stimulus in the form of a supply voltage (Vs), with the remaining side connections to be measured. In the absence of a magnetic field, the side contacts should be at the same voltage. To have the island magnetization direction align with an externally applied magnetic field, the latter must be large enough to saturate the Permalloy material.

With the AMR islands connected in this fashion to form the Wheatstone bridge, these side contacts will produce a different voltage ($\Delta V$) which is a function of the supply voltage, the MR ratio, and the angle between the island current flow (I) and island magnetization (M). If there is only one such bridge, angle measurement is limited to a range of from −45 degree to +45 degree. When combined with a second bridge, which is rotated 45-degrees relative to the first bridge, a wider range of angle, from −90 to +90 degrees, can be measured.

In the prior art, due to the characteristics of the AMR effect in which the resistance change is a function of $\cos^2(\theta)$, where $\theta$ is the angle between the magnetization and current flowing direction, one AMR Wheatstone only detects 90-degree angle while two AMR Wheatstone bridges with 45-degrees orientation difference only allow a measurement of 180-degree angle. In order to measure a full 360-degree angle, an additional Hall sensor must be used in combination with the two Wheatstone bridges.

Figure 2:
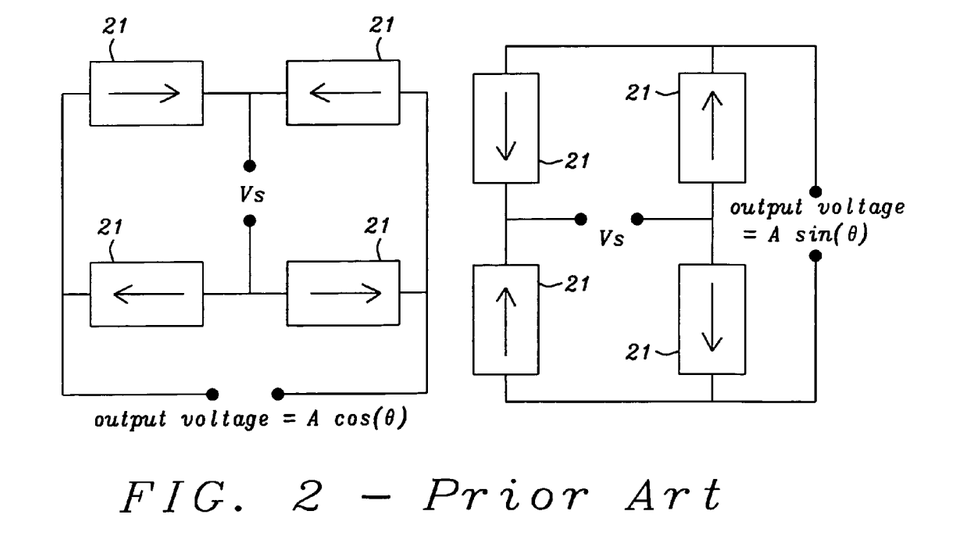
FIG. 2 is a schematic view of an angle sensor formed from two Wheatstone bridges.

Due to the characteristics of GMR or MTJ devices, in which the resistance change is a function of $\cos(\theta)$, where $\theta$ is the angle between the free layer magnetization and the pinned reference layer magnetization, they have the ability to detect the full 360-degree magnetic field. However, in an angle sensor using GMR or MTJ devices, it is required that the reference layers be pinned in various directions, thereby introducing a major challenge to GMR or MTJ based sensor development. In order to achieve maximum sensitivity and accuracy, the pinned magnetizations of the reference layers need to be in both anti-parallel and orthogonal directions as in, for example, an ideal arrangement of eight sensing islands 21 that have identical geometry, differing only in their pinned directions, as shown schematically in FIG. 2.

With continuing advances in micro-magnetic technology, both in regard to the structures formed and the processes needed to form them, the need arises for the ability to apply exchange pinning fields on two or more reference magnetic layers that share the same substrate, in different directions. Typically, an anti-ferromagnetic material (AFM) layer deposited directly underneath or on top of a soft ferromagnetic material layer is utilize to generate an exchange pinning field on the soft ferromagnetic layer through a thermal annealing process. The exchange pinning field direction is in the same direction of the thermal annealing field, i.e., the external field direction during the thermal annealing process. The problem with prior art approaches that uses GMR or MTJ devices has been that if, after applying an exchange pinning field on a first reference ferromagnetic layer in a first direction, it is attempted to apply another exchange pinning field on a second reference ferromagnetic layer in a different direction, application of the second thermal annealing field causes the direction of the first exchange pinning field on the first reference ferromagnetic layer to change.

The prior art approach to dealing with this problem has been to cut out individual sensing islands, all of which have been magnetized in the same direction on a single wafer, and to then rotate them through different angles, following which they are cemented in place and then connected together to form the completed angle sensor. Fabricating the latter in this fashion is expensive, limits the accuracy of the angle sensor, increases the size of the full structure, and is susceptible to the introduction of assembly errors.

A routine search of the prior art was performed with the following references of interest being found:
M. Ruhrig, et al., proposed a single-chip solution using pulsed electric currents to local conductor stripes to set magnetization directions of reference layers [3]. However, in this solution, one has to locally apply current pulse one by one to each GMR or MTJ island, which is costly and is not practical for a mass production.
A. Jander, et al., U.S. Pat. No. 7,054,114 proposed a different solution without the need to apply local current pulses to set each individual GMR or MTJ island's pinning direction. In this prior art, four soft magnetic shields are arranged to have four orthogonal gaps regions where four active sensing islands are located. During thermal annealing process, as an external magnetic field is applied, the fields inside the shield gaps are magnified and their field directions altered to be essentially perpendicular to the gaps. As a result, the pinning directions of these four sensing islands are set perpendicular to gaps that they are located between them. However, using this approach, one still is not able to set pinning magnetizations with anti-parallel directions as required, for example, by an angle sensor based on a simple Wheatstone bridge.

In addition to the above references, the following publications were also found to be of interest:
1. Honeywell application note "Applications of Magnetic Position Sensors"
2. Taras Pokhil, et., "Exchange Anisotropy and Micromagnetic Properties of PtMn/NiFe bilayers," J. Appi. Phys. 89, 6588 (2001)
3. M. Ruhrig, et al., "Angular Sensor Using Tunneling Magnetoresistive Junctions With An artificial Antiferromagnet Reference Electrode and Improved Thermal Stability," IEEE Trans. Magn. V. 40, p. 101, January 2004

SUMMARY OF THE INVENTION

It has been an object of at least one embodiment of the present invention to provide a method for simultaneously generating AFM exchange pinning fields on two or more thin film objects in different directions through the same thermal annealing process, said thin film objects being on the same substrate.

Another object of at least one embodiment of the present invention has been that the thin film objects to which said method is applicable include both GMR and MTJ devices.

Still another object of at least one embodiment of the present invention has been that said method require only a single exposure to a magnetizing field.

A further object of at least one embodiment of the present invention has been that said magnetization exchange pinning directions on the same substrate may have values that span a full 360 degree range.

These objects have been achieved by using a novel method wherein a layer of hard magnetic material is first deposited on and/or close to the objects that are to be simultaneously magnetized in multiple directions. Typically, the objects in question would be GMR or MTJ devices but this is not a requirement, the invention being more general than this. Said hard magnetic layer is then magnetized through exposure to a strong magnetic field.

By shaping the hard layer so that it includes restricted areas and/or suitably oriented non-magnetic gaps, flux from the magnetized hard layer can be directed to run locally in any desired direction. With the magnetized hard layer in place, the assemblage is heated (in the absence of any applied field) to a temperature that lies between the Curie point of the hard layer and the blocking temperature of AFM layer of the objects being magnetized. Once they cool below the AFM blocking temperature, objects will have been magnetized or pinned in the intended directions.

While the method taught by the present invention is of a general nature, being suitable for application to any magnetizable thin film structure, we have applied it mainly to controlling the directions of magnetization of the pinned (reference) layers of assemblages of GMR and MTJ devices. Such assemblages, wherein the pinned layers are not all magnetized in the same direction, are useful for the construction of GMR or MTJ-based magnetic angle sensors.

DESCRIPTION OF THE PREFERRED EMBODIMENTS

The invention discloses a solution to the problem of forming, on a single substrate, multiple structures with exchange pinned ferromagnetic layers in different directions. This technique is then applied to the manufacture of a MTJ or GMR 360-degree magnetic field angle sensor that comprises both anti-parallel and orthogonal predetermined AFM pinning directions. In each MTJ or GMR sensor, there are multiple MTJ islands or GMR stripes that have identical geometries except for their different AFM pinning orientations.

Formation of the GMR/MTJ devices is effected through deposition of a multi-layer structure of the general form (bottom layer listed first)):

seed-layer/AFM/AP2/Ru/AP1/Cu or tunneling barrier/free layer/capping layer

Figure 3:
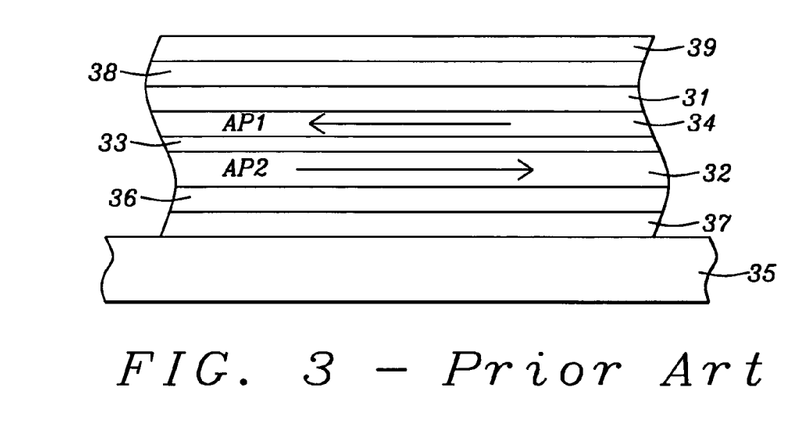
FIG. 3 is a schematic cross-section of a GMR or MTJ device.

In FIG. 3 seed layer 37 is deposited on common substrate 35. Ferromagnetic sub-layer 32 (AP2), non-magnetic antiferromagnetic coupling layer 33 (generally of Ru), and ferromagnetic reference sub-layer 34 (AP1) together form a synthetic antiferromagnetic structure which is pinned by antiferromagnetic (AFM) layer 36. The pinning field, or exchange anisotropy, is related to the exchange coupling at the interface between an AFM layer and a ferromagnetic sub-layer (AP2). One class of antiferromagnetic materials suitable for layer 36 includes the ordered tetragonal (fct) alloys such as PtMn, PtPdMn, NiMn, etc. In their as-deposited state these materials have a non-magnetic fcc structure so the ferromagnetic sub-layer has no exchange bias (pinning) with similar coercivity to the purely ferromagnetic layer. In order to be re-ordered them into their AFM tetragonal (fct) state, a thermal anneal at a temperature higher than the AFM material blocking temperature must be performed. The remaining layers shown in FIG. 3 include Cu spacer (or tunneling barrier) layer 31, free layer 33, and capping layer 39.

Once the layers listed above have been deposited, it is necessary to set the pinning directions of the synthetic AFM layers along their required predetermined directions. How this is achieved is a critical feature of the invention (for both GMR and MTJ devices). As a requirement of the invention, the magnetic moment of sub-layer AP2 is designed to be greater than that of the reference sub-layer AP1, giving a non-zero net magnetic moment to the synthetic layer. Before thermal annealing, local magnetic fields would rotate the net moments of the synthetic layers toward the field directions.

After deposition, the GMR or MTJ film stack is patterned into rectangular stripes 42 having large aspect ratios and different orientations of their long axes. This is achieved through use of ion beam etching (IBE) or reactive ion etching (RIE) in conjunction with suitable etch masks.

Figure 4:
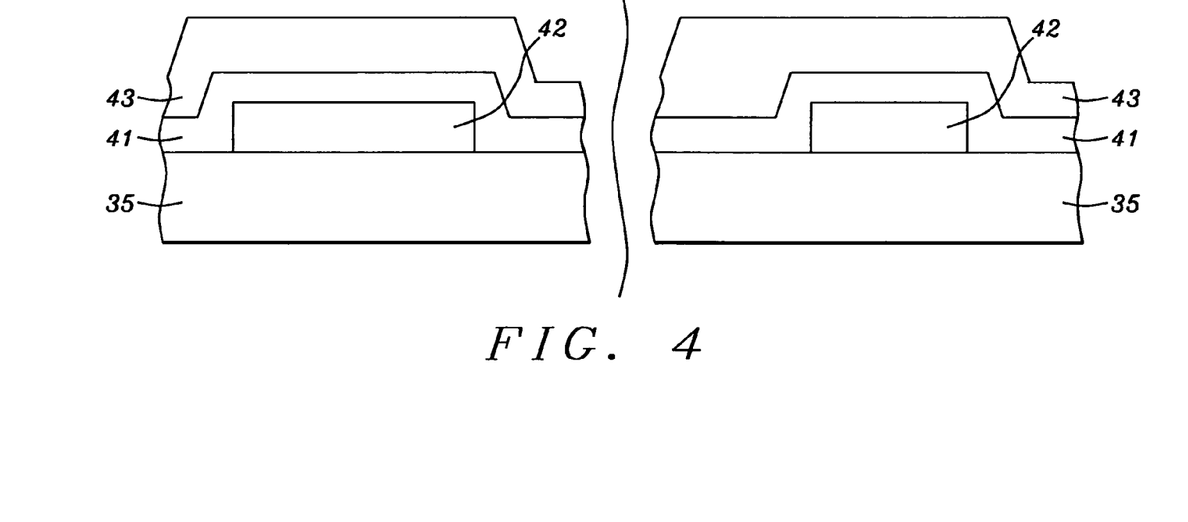
FIG. 4 illustrates the basic structure that is used to implement the method taught by the present invention.

Now follows a key feature of the invention. Referring next to FIG. 4, protective insulating layer 41 is deposited over stripes 42 (viewed end-on in the figure) and hard magnetic layer 43 (typically a material such as CoPt, or CoCrPt is deposited on layer 41.

Figure 5:
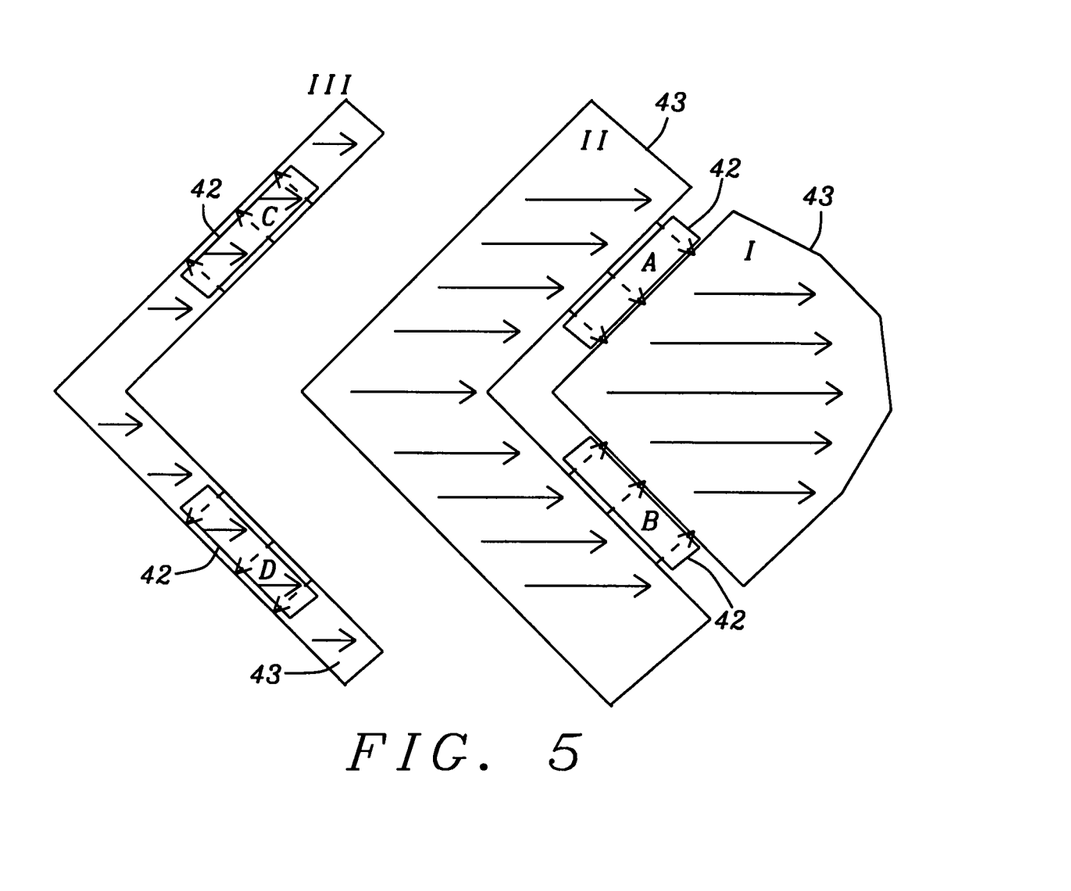
FIG. 5 is a plan view of FIG. 5 following shaping of the hard magnetic layer relative to the GMR or MTJ structures (A, B, C and D) and then magnetizing said hard layer. Thick arrows represent magnetizations in hard magnetic layer and thin arrows represent local bias fields generated by magnetizations in hard magnetic layer.

Then, using appropriate masking and etching techniques, hard magnet layer 43 is patterned into two sets of shapes. As seen in FIG. 5, in shape I-II, on the right, hard magnetic layer 43 abuts previously patterned GMR/MTJ stripes 42 along both their edges but does not overlap them to any extent, while for shape III, layer 43 directly overlies previously patterned GMR/MTJ stripes 42 with no overlap beyond either edge.

Figure 6:
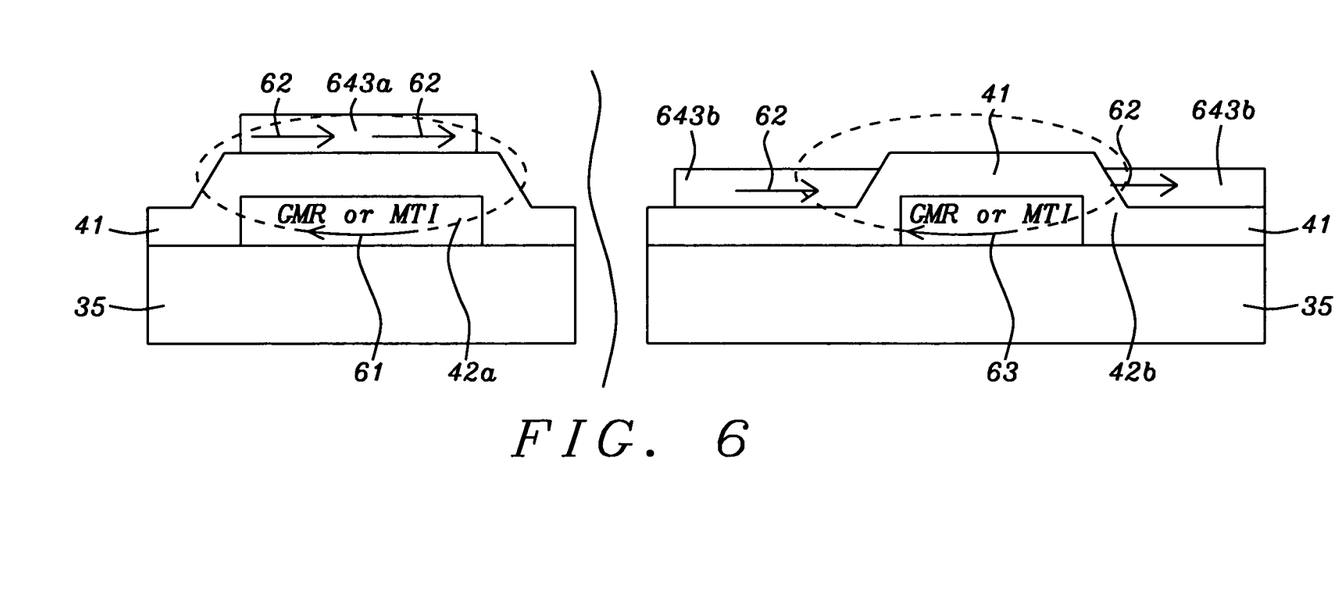
FIG. 6 shows cross-sectional views of two the two shapes given to the hard layer relative to the GMR or MTJ devices.

FIG. 6 shows a cross-sectional view in the vicinity of two of the GMR/MTJ devices seen in FIG. 5. Device 42a on the left is an example of shape III. It is magnetized in direction 61 by the return flux that completes the local magnetic flux loop associated with the magnetization 62 of hard magnetic layer 643a. The device on the right is an example of shape I-II. It is magnetized by hard magnets 643b in direction 63 by flux that follows the path of lowest reluctance between I and II.

Once formation of the various shapes into which the hard magnetic material is patterned has been completed, the newly formed hard magnet shapes are simultaneously magnetized by exposure to a large, externally generated, magnetic field (typically a field of at least 500 Oe). Following removal of the latter, the magnetization of the hard magnets remains unchanged resulting in the generation of biasing magnetic fields which are applied to each individual GMR or MTJ stripe in a directions that is perpendicular to local long edges of hard magnets and determined locally by the relative positions of the hard magnets and the GMR or MTJ stripes, as shown by thin arrows in FIG. 5.

It is important to note that, while shape I-II and shape III have been drawn with the same orientation in FIG. 5, this is not necessary for the invention to operate as described below, the invention being, in fact, independent of what the relative orientations of the different GMR or MTJ stripes might be for any given application of the invention.

Once the required magnetized hard magnet structure is in place, a thermal annealing process is conducted for between about 5 and 500 minutes by heating the assemblage to a temperature of between about 200 and 400 deg. C. in the absence of any external magnetic field. This anneal temperature is set to be below the Curie point of the hard magnetic material but above the blocking temperature of the GMR or MTJ devices' AFM layers. In this way the magnetization of each device's reference layer gets to be pinned (by its re-oriented AFM structure) along the direction set by the hard magnetic layer, as discussed above. Since these patterned GMR or MTJ islands (A, B, C and D as shown in FIG. 5) experience bias fields in different directions determined locally by their adjacent hard magnets, magnetizations in their AP2 sub-layers are set along their local bias field directions during the full thermal annealing process. After the thermal annealing process when the temperature falls below the AFM blocking temperature, exchange pinning fields are induced on the AP2 sub-layers, and pinning directions are set along their original local bias field directions. Due to the strong anti-parallel coupling between the AP1 and AP2 sub-layers, the whole synthetic layer is pinned by AFM exchange field.

At the conclusion of the thermal annealing process, all hard magnetic material used to magnetize the devices is removed by use of suitable selective etching processes.

Note that the various GMR or MTJ shapes described above are merely examples of shaped magnetic layers, disposed to have different relative orientations, that were simultaneously magnetized or exchange pinned in multiple directions on a single substrate through application of the present invention. The method we disclose is not limited to either those shapes or those relative orientations. Rather it is applicable to any set of shaped magnetic layers.

In some cases it is possible to omit protective insulating layer 41 from the magnetization process that we have just described. Omission of insulating layer 41 from the process (where feasible) offers the advantages of better hard magnet-to-GMR (or MTJ) alignment and stronger local hard bias field. We will illustrate this alternate embodiment of the invention using a GMR or MTJ device as the vehicle but it will be understood by those skilled in the art that this alternate embodiment of the invention is applicable to any plurality of thin film structures that are to be permanently magnetized on the same substrate in directions that vary from one structure to the next.

Figure 7:
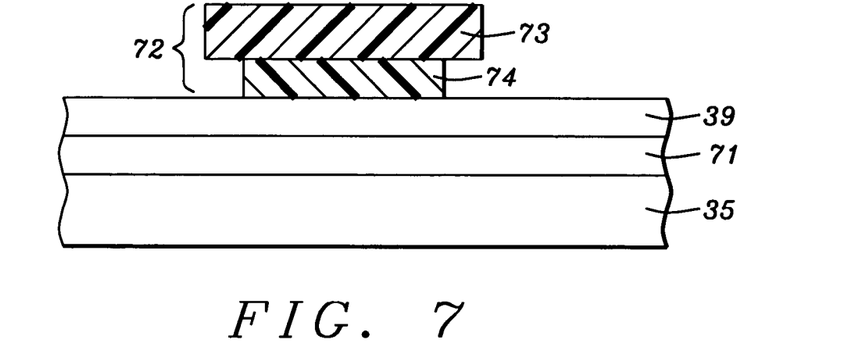
FIG. 7 illustrates the starting point for manufacturing one of the embodiments of the invention.
Figure 8:
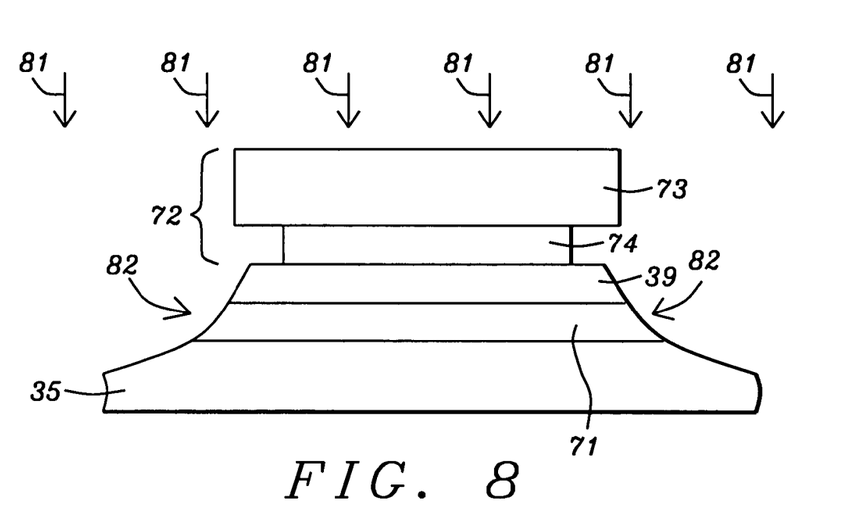
FIG. 8 shows the structure of FIG. 7 after it has been given sloping sidewalls through use of ion beam milling.

Referring now to FIG. 7, capping layer 39 is deposited on GMR or MTJ stack 71 (see layers 31-37 in FIG. 3) which lies on substrate 35. Liftoff mask 72, comprising an upper etch resistant portion 73 that overhangs lower, readily etched portion 74, is formed on the surface of capping layer 39. Then, as illustrated in FIG. 8, Ion Beam Etching (IBE), schematically shown as arrows 81 which represent energetic ions, usually, but not necessarily, of argon, is used to pattern the formless layered structure of FIG. 7 into individual GMR or MTJ devices, each having sloping sidewalls 82, and shaped as large rectangular stripes having a large aspect ratio. The various devices that are so formed will, in general, have different relative orientations of their long axes.

Figure 9:
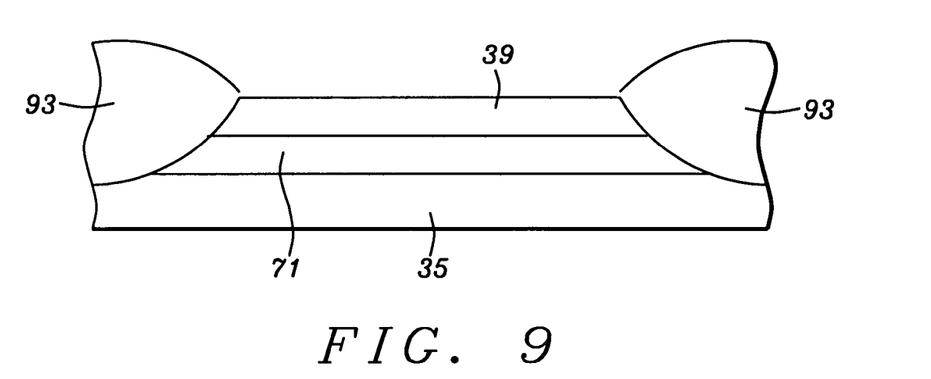
FIG. 9 shows FIG. 8 after the deposition of the hard magnetic layer and following the removal of the liftoff mask.

Then, as illustrated in FIG. 9, layer of hard magnetic material 93 is deposited over the entire surface followed by liftoff of mask 72 through application of a solvent known to readily attack lower mask layer 74. Next, a large external magnetic field (typically a field of at least 500 Oe) is applied to set all hard magnets and is then removed. This is followed by thermal annealing at a temperature between about 200 and 400 deg. C. for between about 5 and 500 minutes, in the absence of an external magnetic field, to set the AFM and their associated pinned reference layers into their intended directions.

Following selective removal of the hard magnetic material, the GMR/MTJ structures are isolated, as appropriate, so that they can operate independently and the structure of which they are a part is completed through the addition of leads, formation of interconnections between devices, formation of I/O connections, etc.

What is claimed is:
1. A method to simultaneously magnetize through exchange pinning fields, in different directions, multiple thin film islands on a common substrate, comprising:
   depositing a seed layer on a single substrate;
   depositing an anti-ferromagnetic (AFM) layer, having a blocking temperature, on said seed layer;
   depositing a layer of magnetizable material on said AFM layer;
   patterning said layer of magnetizable material into first and second islands each having, in plan view, opposing edges a fixed distance apart;
   depositing a protective non-magnetic layer on said substrate, including on said first and second islands;
   depositing a layer of magnetically hard material on said protective non-magnetic layer;
   then patterning said magnetically hard layer into first and second shapes;
   said first shape being disposed to fully cover said first island without extending beyond said first island's edges;
   said second shape comprising two separate sections each having edges that are aligned with said second island's edges and that extend therefrom by amounts that equal or exceed said second island's width, while covering no part of said second island;
   heating, in the absence of a magnetic field, to a temperature higher than said AFM layer blocking temperature and insufficient to demagnetize said hard magnetic layer;
   then returning said islands to room temperature whereby said first island is magnetized in a direction normal to said first island's edges and said second island is magnetized in a direction normal to said second island's edges; and then selectively removing all hard magnetic material and, optionally, said protective layer.

2. The process recited in claim 1 further comprising
depositing a first ferromagnetic sub-layer (AP2) on said AFM layer;
depositing a non-magnetic antiferromagnetic coupling layer on said first ferromagnetic sub-layer; and
depositing a second ferromagnetic sub-layer (AP1) on said non-magnetic antiferromagnetic coupling layer, AP1 having a lower magnetic moment than AP2.

3. The process recited in claim 1 wherein each island's edges are parallel to each other.

4. The process recited in claim 1 wherein said non-magnetic protective layer is selected from the group consisting of AlOx, SiOx, SiNx, Ta/AlOx, Ta/SiOx, Ta/SiNx, Ti/AlOx, Ti/SiOx, and Ti/SiNx.

5. The process recited in claim 1 wherein said hard magnetic material is selected from the group consisting of CoCrPt, CoCrTa, and CoPt.

6. The process recited in claim 1 wherein said direction in which said first island is pinned is at least 90 degrees greater than or less than said external field direction.

7. The process recited in claim 1 wherein said direction in which said second island is pinned is at most 90 degrees greater than or less than said external field direction.

8. The process recited in claim 1 further comprising inserting a lower connecting electrode between said substrate and said seed layer.

9. A process to manufacture a structure that includes multiple magneto-resistive (MR) devices each having a magnetic reference layer whose direction of magnetization is magnetically pinned through contact with an underlying antiferromagnetic (AFM) layer having a blocking temperature, comprising:
depositing, on a single substrate, a stack of layers from which said MR devices may be formed;
patterning said stack of layers to form first and second MR devices each having, in plan view, a rectangular shape with opposing parallel edges;
depositing a protective non-magnetic layer on said substrate, including on said first and second MR devices;
depositing a layer of magnetically hard material on said protective non-magnetic layer;
then patterning said magnetically hard layer into first and second shapes;
said first shape being disposed to fully cover said first MR device without extending beyond said first MR device's edges:
said second shape comprising two separate sections each having edges that are aligned with said second island's edges and that extend away therefrom by amounts that equal or exceed said second island's width, while covering no part of said second MR device;
then exposing said first and second MR devices once to an external magnetic field having a fixed direction as well as sufficient strength to magnetize said hard magnetic layer;
heating said MR devices, in the absence of a magnetic field, to a temperature higher than said AFM layer blocking temperature and insufficient to change MR properties and demagnetize said hard magnetic layer;
then returning said MR devices to room temperature whereby said first MR device is magnetized in a direction normal to said first MR device's edges and said second MR device is magnetized in a direction normal to said second MR device's edges; and
then selectively removing all hard magnetic material and, optionally, said protective layer.

10. The process recited in claim 9 wherein said non-magnetic protective layer is selected from the group consisting of AlOx, SiOx, SiNx, Ta/AlOx, Ta/SiOx, Ta/SiNx, Ti/AlOx, Ti/SiOx, and Ti/SiNx.

11. The process recited in claim 9 wherein said hard magnetic material is selected from the group consisting of CoCrPt, CoCrTa, and CoPt.

12. The process recited in claim 9 wherein said direction in which said first MR device is magnetized is at least 90 degrees greater than or less than said external field direction.

13. The process recited in claim 9 wherein said direction in which said second MR device is magnetized is at most 90 degrees greater than or less than said external field direction.

14. The process recited in claim 9 further comprising inserting a lower connecting electrode between said substrate and said MR layer.

15. The process recited in claim 9 wherein each of said MR devices is selected from the group consisting of GMR and MTJ devices.

16. The process recited in claim 9 wherein said AFM layer is selected from the group consisting of PtMn, NiMn, PtPdMn, IrMn, and FeMn.

17. The process recited in claim 9 further comprising:
depositing a first ferromagnetic sub-layer (AP2) on said AFM layer;
depositing a non-magnetic antiferromagnetic coupling layer on said first ferromagnetic sub-layer; and
depositing a second ferromagnetic sub-layer (AP1) on said non-magnetic antiferromagnetic coupling layer, AP1 having a lower magnetic moment than AP2.

18. The process recited in claim 9 wherein said structure that is manufactured is part of a magnetic angle sensing device.

19. A process to manufacture a structure that includes multiple magneto-resistive (MR) devices each having a magnetic reference layer whose direction of magnetization is magnetically pinned through contact with an underlying antiferromagnetic (AFM) layer having a blocking temperature, comprising:
depositing, on a single substrate, a stack of layers from which said MR devices may be formed, said stack having a top surface;
forming, on said top surface, a liftoff mask that defines location and orientation for said MR devices;
using ion beam milling together with said liftoff mask, patterning said stack of layers to form individual first and second MR stacks, corresponding to first and second of said MR devices each having sloping sidewalls and, in plan view, shaped as rectangular stripes having an aspect ratio of at least 3 and having different relative orientations of their long axes;
depositing a layer of hard magnetic material on said sloping sidewalls followed by removal of said liftoff of mask using standard liftoff techniques whereby said hard magnetic layer selectively coats said sloping sidewalls while leaving an uncoated gap on said top surface of each MR device;
exposing said coated MR devices once to an external magnetic field having an external magnetic field direction and being of sufficient strength to magnetize all of said hard magnetic material in said direction;
heating said MR devices, in the absence of a magnetic field, to a temperature higher than said AFM layer blocking temperature and insufficient to change MR properties and demagnetize said hard magnetic layer;

then returning said MR devices to room temperature whereby each of said MR devices is magnetized in a direction parallel to a line connecting opposing sides of said uncoated gap and whereby said magnetization directions of each of said MR devices is different relative to said external magnetic field direction; and then selectively removing all hard magnetic material while retaining said magnetization directions.

20. The process recited in claim 19 wherein said hard magnetic material is selected from the group consisting of CoCrPt, CoCrTa, and CoPt.

21. The process recited in claim 19 wherein said direction in which said first MR device is magnetized is at least 90 degrees greater than or less than said external field direction.

22. The process recited in claim 19 wherein said direction in which said second MR device is magnetized is at most 90 degrees greater than or less than said external field direction.

23. The process recited in claim 19 wherein each of said MR devices is selected from the group consisting of GMR and MTJ devices.

24. The process recited in claim 19 wherein said AFM layer is selected from the group consisting of PtMn, NiMn, PtPdMn, IrMn, and FeMn.

25. The process recited in claim 19 further comprising:
depositing a first ferromagnetic sub-layer (AP2) on said AFM layer;
depositing a non-magnetic antiferromagnetic coupling layer on said first ferromagnetic sub-layer; and
depositing a second ferromagnetic sub-layer (AP1) on said non-magnetic antiferromagnetic coupling layer, AP1 having a lower magnetic moment than AP2.

26. The process recited in claim 19 wherein said structure that is manufactured is part of a magnetic angle sensing device.

\* \* \* \* \*